United States Patent
Yarnykh et al.

(10) Patent No.: US 7,715,900 B2
(45) Date of Patent: May 11, 2010

(54) QUADRUPLE INVERSION RECOVERY FOR QUANTITATIVE CONTRAST-ENHANCED BLACK BLOOD IMAGING

(75) Inventors: Vasily L. Yarnykh, Seattle, WA (US); Chun Yuan, Bellevue, WA (US)

(73) Assignee: University of Washington, Seattle, WA (US)

( * ) Notice: Subject to any disclaimer, the term of this patent is extended or adjusted under 35 U.S.C. 154(b) by 1567 days.

(21) Appl. No.: 10/740,354

(22) Filed: Dec. 18, 2003

(65) Prior Publication Data

US 2004/0133098 A1 Jul. 8, 2004

Related U.S. Application Data

(60) Provisional application No. 60/435,835, filed on Dec. 19, 2002.

(51) Int. Cl.
*A61B 5/05* (2006.01)

(52) U.S. Cl. .................. 600/410; 324/307; 324/309

(58) Field of Classification Search ............... 600/413, 600/420, 428, 431, 407, 408, 410, 411; 324/306, 324/307, 309
See application file for complete search history.

(56) References Cited

U.S. PATENT DOCUMENTS

| | | | | |
|---|---|---|---|---|
| 5,051,698 | A | | 9/1991 | Ordidge .................. 324/309 |
| 5,256,967 | A | * | 10/1993 | Foo et al. ................. 324/311 |
| 5,588,431 | A | * | 12/1996 | Mani et al. ............... 600/410 |
| 5,810,728 | A | | 9/1998 | Kuhn ...................... 600/410 |
| 5,908,386 | A | * | 6/1999 | Ugurbil et al. ........... 600/410 |
| 6,320,377 | B1 | * | 11/2001 | Miyazaki et al. ......... 324/306 |
| 6,486,668 | B1 | | 11/2002 | Ma .......................... 324/307 |
| 6,498,946 | B1 | * | 12/2002 | Foo et al. ................. 600/410 |
| 2002/0087070 | A1 | * | 7/2002 | Foo et al. ................. 600/420 |
| 2003/0062893 | A1 | * | 4/2003 | Overall .................... 324/306 |
| 2004/0101969 | A1 | | 5/2004 | Viglianti et al. .......... 436/173 |
| 2006/0184002 | A1 | * | 8/2006 | Yarnykh et al. .......... 600/410 |

OTHER PUBLICATIONS

Mai et al. Effect of Respiratory Phases on MR Lung Signal Intensity and Lung Conspicuity Using Segmented Multiple Inversion Recovery Turbo Spin Echo (MIR-TSE). Magnetic Resonance in Medicine 43:760-763 (2000).*

(Continued)

*Primary Examiner*—Brian Casler
*Assistant Examiner*—Elmer Chao
(74) *Attorney, Agent, or Firm*—Ronald M. Anderson

(57) ABSTRACT

A contrast enhancement (CE) agent is infused into blood flowing through a site that is to be imaged with magnetic resonance imaging (MRI). Two double inversion procedures are carried out, forming a quadruple inversion recovery (QIR) pulse sequence. Each double inversion procedure comprises a non-selective and slice-selective inversion RF pulse. The first double inversion procedure is followed by a first predefined inversion delay period, $TI_1$, and the second procedure by a second predefined inversion delay period, $TI_2$. A black-blood image can thus be produced in which blood appears consistently black and tissues surrounding the blood, such as a vessel wall, heart, atherosclerotic plaque, or thrombus, are clearly visible. Unlike the prior art black-blood imaging technique, the QIR method does not require a precise knowledge of the $T_1$ of the blood carrying the CE agent in order to suppress the signal and artifacts caused by the blood flowing through the site.

38 Claims, 3 Drawing Sheets

OTHER PUBLICATIONS

Bonk, Schmiedl, Yuan, Nelson, Black, and Ladd. "Time-of-Flight MR Angiography With Gd-DTPA Hexamethylene Diamine Co-Polymer Blood Pool Contrast Agent: Comparison of Enhanced MRA and Conventional Angiography for Arterial Stenosis Induced in Rabbits." *Journal of Magnetic Resonance Imaging*, 11:638-646 2000. © 2000 Wiley-Liss, Inc.

Cai, Hatsukami, Ferguson, Small, Polissar, and Yuan. "Classification of Human Carotid Atherosclerotic Lesions With In Vivo Multicontrast Magnetic Resonance Imaging." *Circulation, Journal of the American Heart Association*, Sep. 10, 2002, pp. 1368-1373.

Chu, Kampschulte, Ferguson, Kerwin, Yarnykh, O'Brien, Polissar, Hatsukami, and Yuan. "Occurrence and Staging of Hemorrhage in the Advanced Carotid Atherosclerotic Plaque: An In-Vivo Multi Contrast High Resolution MRI Study." Submitted to *Stroke*, Oct. 2003. 25pp.

Han and Yuan. "Plaque Morphological Quantitation." *Angiography and Plaque Imaging, Advanced Segmentation Techniques*. Chapter 2. Jasjit Suri and Swamy Laxminarayan, Eds. The Biomedical Engineering Series, Michael Neuman, Series Ed. CRC Press, Boca Raton, FL. Chapter 2. pp. 43-76. (2003).

Han, Hatsukami, and Yuan. "A Multi-Scale Method for Automatic Correction of Intensity Non-Uniformity in MR Images." *Journal of Magnetic Resonance Imaging*, 13:428-436 (2001). © Wiley-Liss, Inc.

Han, Hatsukami, Hwang, and Yuan. "A Fast Minimal Path Active Contour Model." *IEEE Transactions On Image Processing*, vol. 10, No. 6, Jun. 2001. pp. 865-873.

Han, Kerwin, Hatsukami, Hwang, and Yuan. "Detecting Objects in Image Sequences Using Rule-Based Control in an Active Contour Model." *IEEE Transaction on Biomedical Engineering*, vol. 50, No. 6, Jun. 2003. pp. 705-710.

Hatsukami, Ross, Polissar, and Yuan. "Visualization of Fibrous Cap Thickness and Rupture in Human Atherosclerotic Carotid Plaque In Vivo With High-Resolution Magnetic Resonance Imaging." *Circulation, Journal of the American Heart Association*. Aug. 29, 2000. pp. 959-964.

Kaneko, Skinner, Raines, Yuan, Rosenfeld, Wight, and Ross. "Detection of dissection and remodeling of atherosclerotic lesions in rabbits after balloon angioplasty by magnetic-resonance imaging." *Coronary Artery Disease*, Diagnostic Methods, 2000, vol. 11 No. 8. pp. 599-606.

Kang, Polissar, Han, Lin, and Yuan. "Analysis of the Measurement Precision of Arterial Lumen and Wall Areas Using High-Resolution MRI." Measurement Precision of High-Resolution MRI. *Magnetic Resonance in Medicine*, 44:968-972 (2000).

Kerwin and Yuan. "Analysis and Visualization of Atherosclerotic Plaque Composition by MRI." *Angiography and Plaque Imaging, Advanced Segmentation Techniques*. Chapter 7. Jasjit Suri and Swamy Laxminarayan, Eds. The Biomedical Engineering Series, Michael Neuman, Series Ed. CRC Press, Boca Raton, FL. Chapter 3. pp. 77-117, (2003).

Kerwin, Cai, and Yuan. "Noise and Motion Correction in Dynamic Contrast-Enhanced MRI for Analysis for Atherosclerotic Lesions." *Magnetic Resonance in Medicine*, 47:1211-1217 (2002). pp. 1211-1217.

Kerwin, Han, Chu, Xu, Luo, Hwang, Hatsukami, and Yuan. "A Quantitative Vascular Analysis System for Evaluation of Atherosclerotic Lesions by MRI." Medical Imaging Computing and Computer-Assisted Intervention—MICCAI 2001, 4th International Conference Utrecht, The Netherlands, Oct. 2001 Proceedings. Niessen and Viergever, Eds. 9pp.

Kerwin, Hooker, Spilker, Vicini, Ferguson, Hatsukami, and Yuan. "Quantitative Magnetic Resonance Imaging Analysis of Neovasculature Volume in Carotid Atherosclerotic Plaque." *Circulation, Journal of the American Heart Association*, Feb. 18, 2003. pp. 851-856.

Luo, Polissar, Han, Yarnykh, Kerwin, Hatsukami, and Yuan. "Accuracy and Uniqueness of Three In Vivo Measurements of Atherosclerotic Carotid Plaque Morphology With Black Blood MRI." *Magnetic Resonance in Medicine*, 50:75-82 (2003).

Miller and Yuan. "Atherosclerotic Plaque Imaging Techniques in Magnetic Resonance Images." *Angiography and Plaque Imaging, Advanced Segmentation Techniques*. Chapter 7. Jasjit Suri and Swamy Laxminarayan, Eds. The Biomedical Engineering Series, Michael Neuman, Series Ed. CRC Press, Boca Raton, FL. pp. 299-329. (2003).

Mitsumori, Hatsukami, Ferguson, Kerwin, Cai, and Yuan. "In Vivo Accuracy of Multisequence MR Imaging for Identifying Unstable Fibrous Caps in Advanced Human Carotid Plaques." *Journal of Magnetic Resonance Imaging*, 17:410-420 (2003).

Naghavi, Morteza et al. "From Vulnerable Plaque to Vulnerable Patient, A Call for New Definitions and Risk Assessment Strategies: Part I." *Circulation, Journal of the American Heart Association*, Oct. 7, 2003. pp. 1664-1672.

Naghavi, Morteza et al. "From Vulnerable Plaque to Vulnerable Patient, A Call for New Definitions and Risk Assessment Strategies: Part II." *Circulation, Journal of the American Heart Association*, Oct. 14, 2003. pp. 1772-1778.

Saam and Yuan. "Vascular Imaging." *Encyclopedia of Biomaterials and Biomedical engineering*. Oct. 2003. 26pp.

Saam et al. In Vivo Comparison of the Atherosclerotic Lesion Ipsilateral and Contralateral to the Side of Symptomatic Carotid Disease: A High-Resolution, Multi-Contrast Magnetic Resonance Imaging Study. Submitted to *Stroke*, Oct. 2003. 25pp.

Saam, Cai JM, Cai YQ, Ma, Xu, Polissar, Hatsukami, and Yuan. "Differences in Carotid Artery Atherosclerotic Lesion Characteristics from the Index- and Non-Index Side of Symptomatic Patients: A High-Resolution, Multi Contrast Magnetic Resonance Imaging Study." Submitted to *Stroke*, 2003. 19pp.

Schwartz, Hatsukami, and Yuan. "Molecular Markers, Fibrous Cap Rupture, and the Vulnerable Plaque, New Experimental Opportunities." *Circulation, Journal of the American Heart Association*, Sep. 14, 2001. pp. 471-473.

Song, Wright, Wolf, and Wehrli. "Multislice Double Inversion Pulse Sequence for Efficient Black-Blood MRI." *Magnetic Resonance in Medicine* 47:616-620 (2002) DOI 10.1002/mrm.10094.

Winn, Schmiedl, Reichenbach, Beach, Nghiem, Dimas, Daniel, Maravilla, and Yuan. "Detection and Characterization of Atherosclerotic Fibrous Caps with T2-Weighted MR." *AJNR Am J Neuroradiol* 19:129-134, Jan. 1998.

Xu, Hwang, and Yuan. "Segmentation of Multi-Channel Image with Markov Random Field Based Active Contour Model." © Kluwer Academic Publishers, The Netherlands 2002. Accepted Aug. 7, 2001. 11pp.

Yarnykh and Yuan. "High-Resolution Multi-Contrast MRI of the Carotid Artery Wall for Evaluation of Atherosclerotic Plaques." *Current Protocols in Magnetic Resonance Imaging*, Unit A1.4, Intracranial Arterial Disease. Supplement 11. 2003. 18pp.

Yarnykh and Yuan. "Multislice Double Inversion-Recovery Black-Blood Imaging With Simultaneous Slice Reinversion." *Journal of Magnetic Resonance Imaging*, 17:478-483 (2003).

Yarnykh and Yuan. "$T_1$-Insensitive Flow Suppression Using Quadruple Inversion-Recovery." *Magnetic Resonance in Medicine*. 48:899-905, (2002).

Yarnykh, Vasily L. "Pulsed Z-Spectroscopic Imaging of Cross-Relaxation Parameters in Tissues for Human MRI: Theory and Clinical Applications." *Magnetic Resonance in Medicine*, 47:929-939 (2002).

Yuan, Beach, Smith, and Hatsukami. "Measurement of Atherosclerotic Carotid Plaque Size in Vivo Using High Resolution Magnetic Resonance Imaging." *Circulation, Journal of the American Heart Association*. Dec. 15, 1998. pp. 2666-2671.

Yuan, Hatsukami, and O'Brien. "High-Resolution Magnetic Resonance Imaging of Normal and Atherosclerotic Human Coronary Arteries Ex Vivo: Discrimination of Plaque Tissue Components." *Journal of Investigative Medicine*, vol. 49, No. 6, Nov. 2001. pp. 491-499.

Yuan, Kerwin, Ferguson, Polissar, Zhang, Cai, and Hatsukami. "Contrast-Enhanced High Resolution MRI for Atherosclerotic Carotid Artery Tissue Characterization." *Journal of Magnetic Resonance Imaging*, 15:62-67 (2002).

Yuan, Lin, Millard, and Hwang. "Closed Contour Edge Detection of Blood Vessel Lumen and Outer Wall Boundaries in Black-Blood MR Images." *Magnetic Resonance Imaging*, vol. 17, No. 2, 1999. pp. 257-266.

Yuan, Miller, Cai, and Hatsukami. "Carotid atherosclerotic wall imaging by MRI." *Neuroimaging Clinics of North America*, 12 (2002). pp. 391-401.

Yuan, Mitsumori, Beach, and Maravilla. "Carotid Atherosclerotic Plaque: Noninvasive MR Characterization and Identification of Vulnerable Lesions." *Radiology*, vol. 221, No. 2, Nov. 2001. pp. 285-299.

Yuan, Mitsumori, Ferguson, Polissar, Echelard, Ortiz, Small, Davies, Kerwin, and Hatsukami. "In Vivo Accuracy of Multispectral Magnetic Resonance Imaging for Identifying Lipid-Rich Necrotic Cores and Intraplaque Hemorrhage in Advanced Human Carotid Plaques." *Circulation, Journal of the American Heart Association*, Oct. 23, 2001. pp. 2051-2056.

Yuan, Zhang, Polissar, Echelard, Ortiz, Davis, Ellington, Ferguson, and Hatsukami. "Identification of Fibrous Cap Rupture With Magnetic Resonance Imaging Is Highly Associated With Recent Transient Ischemic Attack or Stroke." *Circulation, Journal of the American Heart Association*, Jan. 15, 2002. pp. 181-185.

Yuan, Zhao, and Hatsukami. "Quantitative Evaluation of Carotid Atherosclerotic Plaques by Magnetic Resonance Imaging." *Current Atherosclerosis Reports 2002*, vol. 4. © 2002 Current Science Inc. pp. 351-357.

Zhang, Cai, Luo, Han, Polissar, Hatsukami, and Yuan. "Measurement of Carotid Wall Volume and Maximum Area with Contrast-enhanced 3D MR Imaging: Initial Observations." *Radiology*, vol. 228, No. 1, Jul. 2003. pp. 200-205.

Zhang, Hatsukami, Polissar, Han, and Yuan. "Comparison of carotid vessel wall area measurements using three difference contrast-weighted black blood MR imaging techniques." *Magnetic Resonance Imaging*, 19 (2001) pp. 795-802.

Zhao, Yuan, Hatsukami, Frechette, Kang, Maravilla, and Brown. "Effects of Prolonged Intensive Lipid-Lowering Therapy on the Characteristics of Carotid Artherosclerotic Plaques In Vivo by MRI, A Case-Control Study." *Arterioscler Thromb Vasc Biol.* Oct. 2001. pp. 1623-1629.

* cited by examiner

QUADRUPLE INVERSION RECOVERY FOR QUANTITATIVE CONTRAST-ENHANCED BLACK BLOOD IMAGING

RELATED APPLICATIONS

This application is based on prior provisional patent application, Ser. No. 60/435,835, filed on Dec. 19, 2002, the benefit of the filing date of which is hereby claimed under 35 U.S.C. §119(e).

GOVERNMENT RIGHTS

This invention was made with U.S. Government support under Grant No. RO1-HL56874 awarded by NIH-NIHB1. The U.S. Government has certain rights in the invention.

FIELD OF THE INVENTION

This invention generally pertains to magnetic resonance imaging (MRI) and more specifically, pertans to a method, a pulse sequence, and a system that make use of a plurality of radiofrequency (RF) inversion pulses grouped into double-inversion procedures in order to suppress the signal from flowing blood having a variety of $T_1$ relaxation times caused by the presence of a contrast-enhancing agent.

BACKGROUND OF THE INVENTION

Black-blood imaging is a technique developed to improve the visualization of blood vessels and the heart in magnetic resonance images so as to more clearly reveal pathologic tissues and morphologic abnormalities, which appear close to the blood-wall interface. (See Edelman R. R., Chien D., and Kim D., "Fast Selective Black Blood MR Imaging," *Radiology* 1991; 181:655-660.) These improvements in visualization include the elimination of image artifacts arising from flowing blood and a reduction in the residual blood signal, which may mask pathologic conditions such as atherosclerotic plaque or thrombus formation. The combination of black-blood imaging with contrast enhancement (CE) offers a high potential for various cardiovascular applications, and in particular, for improved high-resolution MRI of atherosclerotic plaque. (See Yuan C. et al., "Contrast-Enhanced High Resolution MRI for Atherosclerotic Carotid Artery Tissue Characterization," *Journal of Magnetic Resonance Imaging*, 2002; 15:62-67.) The ability to provide high resolution images of plaque in the carotid arteries and other vessels is becoming increasingly important in assessing the potential vulnerability and risk of patients to stroke and other cardiovascular diseases. However, due to the significant shortening of $T_1$ in blood and the variability of $T_1$ caused by the use of a contrast enhancement (CE) agent, a traditional method for achieving black-blood imaging, such as double inversion-recovery (DIR) cannot guarantee effective blood suppression on post-contrast images. This issue is especially important for quantitative image analysis, such as the calculation of contrast enhancement and morphological measurements. The crucial problem of DIR is that it is necessary to know the relaxation time, $T_1$, of blood in order to calculate the inversion time (TI). The DIR method can effectively suppress the blood signal if and only if TI is determined so as to allow the magnetization of blood to approach zero. However, the use of CE agent decreases the $T_1$ parameter of blood by an unpredictable amount. Uncertainties in the effect of CE on $T_1$ arise from various factors related to the injection technique, flow dynamics, concentration, and time between injection and imaging. Determining the proper TI is therefore uncertain. Accordingly, it would be critical to employ an MRI technique that provides the benefits of DIR in achieving black-blood images, but is much less sensitive to variations in the $T_1$ parameter of blood due to application of a CE agent.

SUMMARY OF THE INVENTION

As explained above, the current approach used for black-blood imaging in MRI of the heart and blood vessels has typically applied the DIR method. However, DIR only provides efficient suppression of the blood signal within a narrow range of $T_1$ values at any selected TI. The present invention addresses this issue by suppressing the signal and artifacts from flowing blood in MRI of the heart and blood vessels over a wide range of $T_1$ values, so that the changes in $T_1$ caused by the infusion of a CE agent are not problematic in achieving high-quality black blood images.

More specifically, one aspect of the present invention is directed to a method for suppression of a signal from flowing blood in MRI, so that tissue surrounding the blood is clearly visible in the image, while the blood is consistently black. The method comprises the step of applying two (or more) double-inversion procedures before signal acquisition. The method starts when a first double-inversion procedure is applied. After waiting for a first predefined inversion delay period, a second double-inversion procedure is carried out. Each double-inversion procedure comprises a non-selective RF pulse applied to provide a non-selective inversion of the magnetization in the entire object and a slice-selective pulse that is targeted to invert the magnetization in a slice, a group of slices, or a three-dimensional (3-D) slab. After waiting for a second predefined inversion delay period, a signal is acquired for processing to produce an image in which the blood flowing through the slice is black, in contrast to tissue comprising the blood vessel wall, heart, and any pathologic tissue such as atherosclerotic plaque or thrombus that may have been formed inside the blood vessel. The first and second predefined inversion delay periods are selectively determined so that effects of the flowing blood are suppressed in the image over a wide range of $T_1$ values, which may occur in the blood both in the presence and in the absence of the CE agent. This result is achieved when a longitudinal magnetization of the blood flowing through the site approaches zero at a time when the signal is acquired for imaging.

The longitudinal magnetization of the blood varies as a combination of exponential functions of several parameters. These parameters include the first predefined inversion delay period, the second predefined inversion delay period, a repetition time, TR, and a current $T_1$ value of the blood, which depends on the concentration of the CE agent infused. The CE agent reduces the $T_1$ value for blood in an unpredictable manner. However, the residual magnetization of the blood is negligibly small for a wide range of $T_1$ after application of the sequence of RF pulses in accord with the present invention. This range covers all possible $T_1$ variability. Thus, the method produces consistently black-blood images independently of the presence and concentration of the CE agent in the blood.

In another aspect of the invention, a method for black-blood contrast enhanced MRI is defined. The method starts with the step of infusing the CE agent into the blood. The CE agent used preferably includes gadolinium derivatives, although other suitable CE agents may instead be used. After waiting a sufficient time, blood carrying a portion of the CE agent flows through the site. At that time, the images are acquired using the method of the present invention, which includes two double-inversion procedures, each of which is followed by one of two predefined time periods. As was noted above, this method effectively suppresses the blood signal. Thus, tissues surrounding blood are clearly visible after CE without any problems associated with flow artifacts and a residual blood signal.

In addition, the black-blood image can be obtained at the site before infusion of the CE agent. Essentially, this image guarantee consistent suppression of the signal from blood using the same parameters that are used in the present invention for post-CE imaging. Because images before and after CE have been obtained using the identical method, any changes of signal intensity are caused only by the penetration of the CE agent into tissue. This information disclosed by the resulting images is used for the characterization of pathologic tissues in the cardiovascular system, such as atherosclerotic plaques, thrombi, myocardial infarction, and other conditions.

Another aspect of the invention is directed to a pulse sequence for quadruple inversion-recovery imaging. The pulse sequence includes two double inversion RF pulse pairs, each of which is followed by one of two inversion delays. Each double inversion pulse pair includes two inversion RF pulses, one of which is non-selective and the other of which is slice-selective or slab-selective. The pulse sequence also includes all RF and magnetic field gradient pulses needed to generate, encode, and acquire an MR signal. Optionally, the sequence may contain more than two double inversion blocks in order to improve blood suppression effect.

Yet another aspect of the invention is directed to a system for quadruple inversion-recovery data acquisition. The system includes a computer having a processor and a memory in which a set of machine instructions are stored. The machine instructions are executed by the processor. The computer is connected to an MRI apparatus and execution of the machine instructions causes the MRI apparatus to generate the quadruple inversion recovery (QIR) pulse sequence. The MRI apparatus is thus controlled by the computer to produce images using magnetic field and RF pulses as discussed above. The machine instructions also determine appropriate inversion delays to achieve black-blood imaging m which the blood signal is substantially zero. The execution of the QIR pulse sequence can be performed with a TR or synchronized with the cardiac rhythm of the living object (human or animal).

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Method

Sequence: In the present invention, suppression of the flowing blood signal and artifacts is achieved using a quadruple inversion recovery (QIR) pulse sequence. The QIR pulse sequence includes two double inversion pulse pairs, the first double inversion pulse pair being followed by an inversion delay period, $TI_1$, and the second double inversion pulse pair being followed by an inversion delay period, $TI_2$. The double inversion procedure is known from its use in a double inversion-recovery (DIR) pulse sequence. Use of the DIR sequence for achieving black-blood imaging is generally well known to those of ordinary skill in the art of MRI. It is also known that the DIR method provides efficient suppression of the blood signal in a narrow range of $T_1$ values, which makes the use of DIR problematic in the presence of contrast enhancing agents, since such agents strongly affect the $T_1$ of blood. However, in accord with the present invention, by performing a plurality of successive double inversion procedures, each followed by an appropriate inversion delay period, black-blood imaging can be achieved without requiring a precise knowledge of $T_1$ in blood after infusion of the contrast enhancement agent. Although initially tested as a QIR sequence including two double inversions, it is contemplated that the present invention may be implemented as a sequence of more than two double inversions, each followed by an appropriate inversion delay period.

Figure 4:
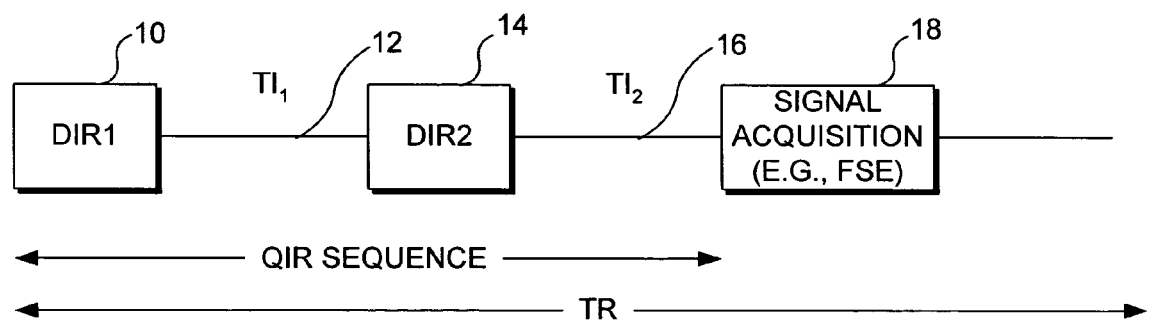
FIG. 4 is a timing diagram of the FSE-QIR sequence.

FIG. 4 illustrates the steps employed in the QIR pulse sequence. As shown therein, a first double inversion 10 is carried out, followed by a first inversion delay period, $TI_1$, which is identified by reference number 12. A second double inversion 14 is then implemented, followed by a second inversion delay period, $TI_2$, which is identified by a reference number 16. A signal produced by the tissue being imaged is then acquired, for example, using an FSE pulse sequence, as indicated in a block 18. Generally, any two-dimensional (2-D) or 3-D acquisition sequence can be used to produce signal excitation and spatial encoding instead of the FSE pulse sequence.

In each double inversion procedure, a slice-selective inversion radio frequency (RF) pulse is applied to the site to be imaged, where the blood flow occurs (e.g., blood vessels or the heart) immediately after a nonselective inversion RF pulse has been applied. The inversion pulses also can be applied in the reverse time order with the same effect. The nonselective pulse inverts the magnetization of the entire object placed inside a transmit coil of the scanner, which is generally the part of the patient's body covered by the coil and includes a substantial volume of circulating blood. The slice selective pulse re-inverts the magnetization of the imaged slice to its initial direction. Also, it should be noted that adiabatic pulses can be used for either the selective or the nonselective inversion in order to reduce phase errors of magnetization across the object. The thickness of the re-inverted slice is generally greater (1.5-3 times) than the thickness of the imaged slice in order to avoid displacement effects caused by breathing and heart pulsation. The slice selective pulse can be applied to a single slice, or a group of slices, or a three-dimensional slab depending on the acquisition method (2-D single- or multi-slice, or 3-D). If the first and second inversion delay periods, $TI_1$ and $TI_2$ are properly selected, the longitudinal blood magnetization, $M_z$, should approach zero after the second inversion delay period, $TI_2$. While the first and second inversion delay periods can be mathematically calculated, it is also possible to empirically determine each of the inversion delay periods using graphical methods.

In an initial test of the present invention that confirmed its ability to provide improved black-blood imaging after an injection of the contrast enhancement agent, the QIR pulse sequence was implemented on a 1.5T MR scanner (GE Signa EchoSpeed™) in combination with FSE readout sequence. It will be understood that other suitable image acquisition techniques can be implemented to obtain the signal from a site produced using MRI. The QIR pulse sequence can be implemented with two timing options. In the first option, the repetition time (TR) or the sequence is fixed and defined by the operator. In the second option, the execution of the sequence is synchronized with the cardiac rhythm of the patient so that the repetition time is equal to one or more R-to-R intervals. This cardiac-gated acquisition mode is necessary for imaging of anatomic locations affected by heart pulsation such as the heart itself and the aorta. In the tests demonstrating the efficacy of the present invention, the QIR pulse sequence was implemented with adiabatic hyperbolic-secant RF pulses applied for slice-selective inversion and rectangular RF pulses applied for non-selective inversion. It further will be understood that other pulse shapes can be used in the QIR pulse sequence to achieve spatially selective and nonselective inversion of magnetization.

Figure 1:
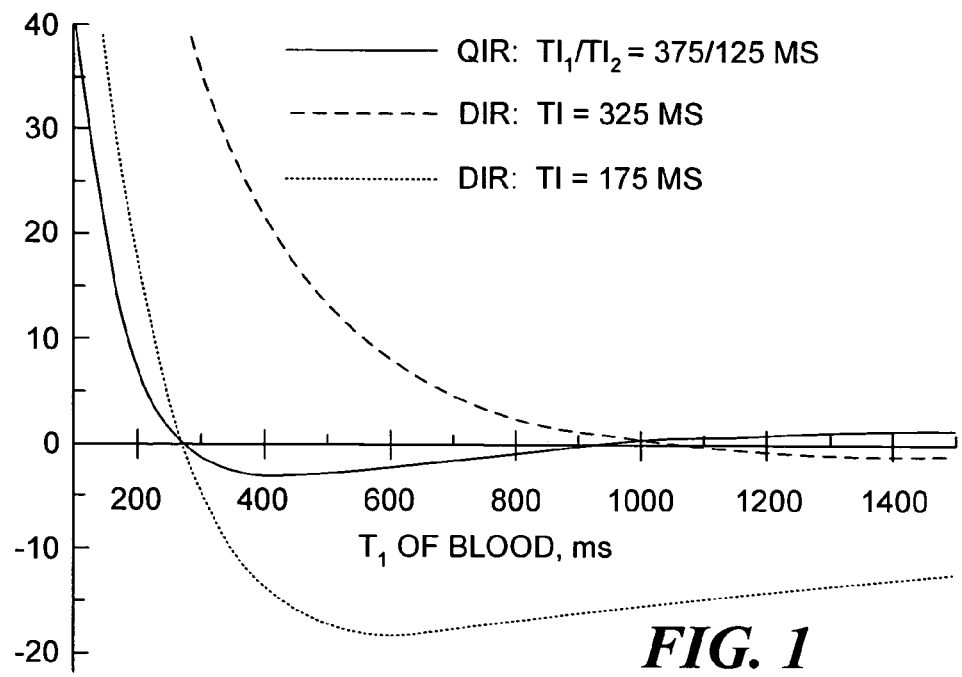
FIG. 1 is a graph for a simulation showing the magnetization of blood as a function of $T_1$ for DIR and QIR sequences, at a TR equal to 800 ms.

Theory: Longitudinal magnetization of blood outside an imaging slice under the action of the QIR pulse sequence is described by the following equation:

$$M_z = \frac{1 - \exp\left(-\frac{TR}{T_1}\right) - 2\exp\left(\frac{-TI_2}{T_1}\right) + 2\exp\left(\frac{-(TI_2 + TI_1)}{T_1}\right)}{1 - \exp\left(\frac{-TR}{T_1}\right)}$$

which has two zero solutions at predefined TR, $TI_1$, and $TI_2$ (see the example shown in FIG. 1). In addition, longitudinal magnetization of blood outside an imaging slice is negligibly small over a wide range of $T_1$, as seen in FIG. 1, which accounts for the feasibility of suppressing blood signal with a variety of $T_1$ values without knowledge of the actual $T_1$.

MRI Experiments: The effect of DIR and QIR pulse sequences on a steady tissue signal was studied ex vivo using a sample of fresh bovine muscle. Subsequently, to test the QIR sequence in vivo, high-resolution $T_1$-weighted images of carotid arteries were obtained from two carotid atherosclerosis patients (before and after contrast enhancement agent administration) and two healthy volunteers (who did not receive any contrast enhancement injection). Informed consent was obtained from all participants. The protocol included DIR (inversion time, TI=325 ms) and QIR ($TI_1/TI_2$=375/125 ms) scans, with the following parameters of the FSE acquisition sequence: TR=800 ms, TE=11 ms, echo train length=8, two signal averages, matrix 256×256, field of view 13×7 cm, and a slice thickness of 2 mm. Post-contrast scans were acquired 5-15 min. after an injection of 20 ml of a gadolinium-based contrast agent (Omniscan™).

Results of the Experiments

As was shown by simulations and the ex vivo experiments, the following limitations of the DIR method hampers quantitative contrast enhanced studies:

1. The DIR method provides efficient suppression of the blood signal within only a narrow range of $T_1$ values at any chosen TI (see FIG. 1, which illustrates two plots of blood magnetization for the DIR sequence, with TI=325 ms, and with TI=175 ms). Thus, DIR is prone to the blood flow signal and artifacts that are caused by variations of $T_1$ in blood after a contrast enhancement agent administration.

Figure 2:
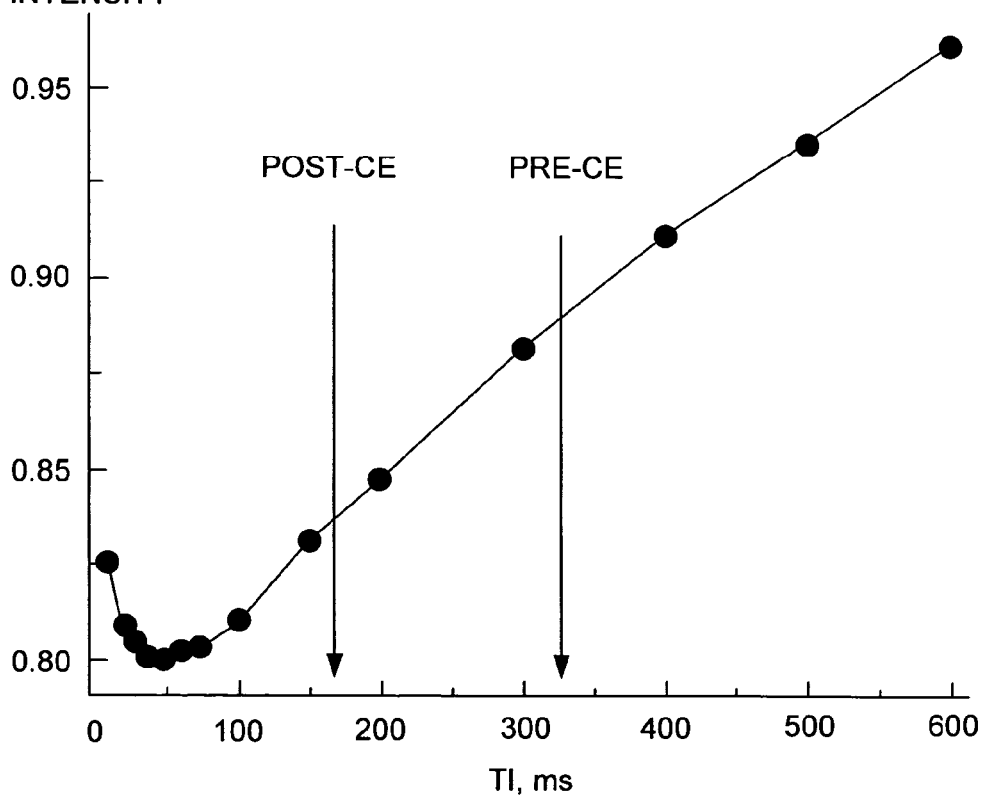
FIG. 2 is a graph of normalized signal intensity in relation to pre-CE and post-CE and TI for a DIR-fast-spin echo (FSE) sequence (with IR equal to 800 ms) measured using fresh bovine muscle.

2. DIR is characterized by strong (up to 20% of relative change) dependence of a steady tissue signal on TI (as shown in FIG. 2). It has been demonstrated that this dependence is determined mainly by the magnetization transfer (MT) effect induced by the pair of inversion pulses used in the DIR procedure. While the single DIR procedure should be applied with different TI for pre- and post-contrast enhancement infusion scans to obtain satisfactory blood signal suppression, it may cause a misinterpretation of the contrast enhancement in weakly enhanced tissues.

Figure 3:
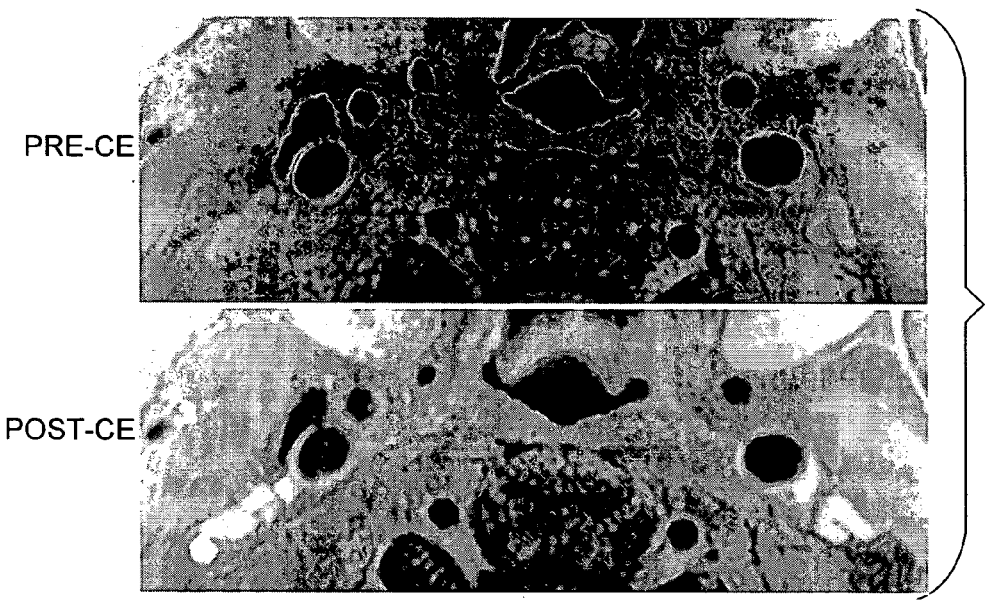
FIG. 3 illustrates $T_1$-weighted QIR-FSE MRI images, pre-CE (top) and post-CE (bottom), of a carotid atherosclerosis patient.

Features of the QIR sequence. The QIR sequence with properly chosen $TI_1$ and $TI_2$ provides efficient blood signal suppression over a relatively wide range of TI values (as shown by the solid line for the QIR sequence in FIG. 1). In the present protocol, the parameters of the QIR-FSE sequence were adjusted to guarantee at least 90% blood signal suppression, starting from an expected $T_1$=200 ms. The predefined values for $TI_1$ and $TI_2$ used were sufficient for obtaining perfect lumen visualization in both arterial and venous vessels (as shown in FIG. 3). FIG. 3 includes images made with the QIR sequence in accord with the present invention for both pre-contrast enhancement agent injection (top image) and post-contrast enhancement agent injection (bottom image).

Note that unlike DIR, QIR does not require a precise knowledge of $T_1$ for blood after a contrast enhancement agent injection, since the corresponding suppression curve is quite flat (see the solid line curve for the QIR pulse sequence shown in FIG. 1). While the QIR sequence is subjected to a decrease of steady tissue signal due to MT saturation, similar to that of DIR, both pre-, and post-contrast QIR images contain the same amount of MT effect, because they were obtained with the identical QIR sequence. As a result, it is possible to attribute quantitative changes of signal intensity to the influence of a contrast enhancement agent only. Although the saturation of steady tissues by the QIR sequence appeared to be slightly higher than that for DIR preparation (3-9% of further signal decrease), this effect was too small to affect the overall image quality.

System for Implementing the Present Invention

Figure 5:
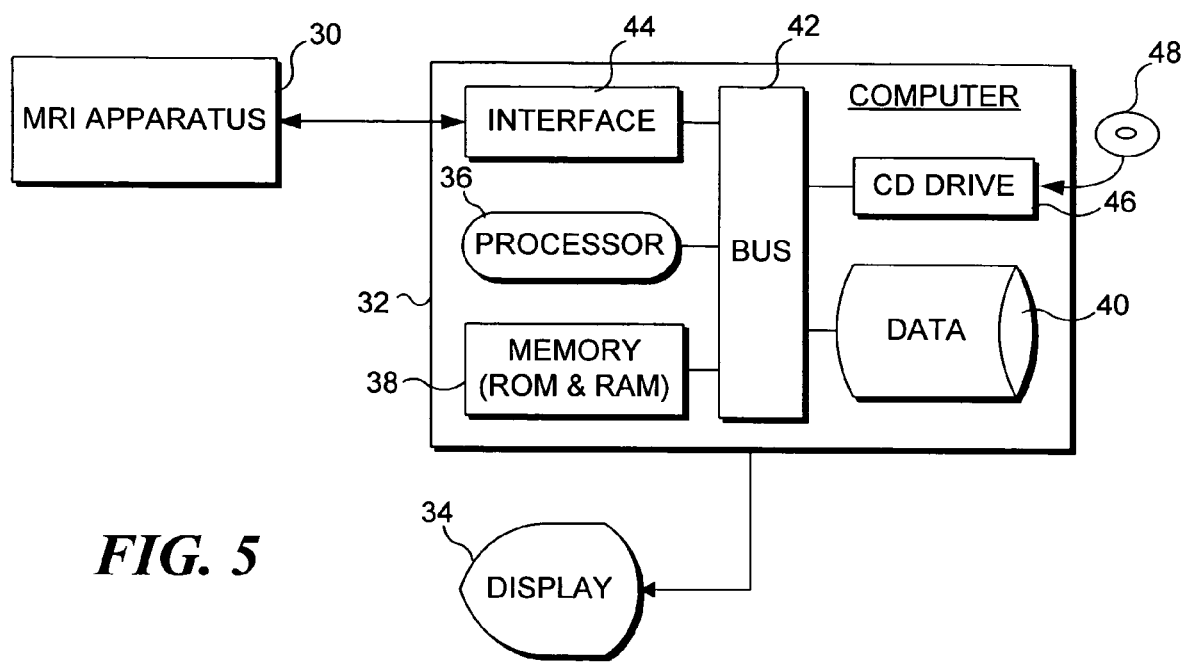
FIG. 5 is a block diagram showing a computer coupled to an MRI apparatus, for practicing the present invention.

FIG. 5 schematically illustrates a system for implementing the present invention that includes a generally conventional MRI apparatus 30 that is controlled by a computer 32. Computer 32 may be a generally conventional personal computer (PC) or a dedicated controller specifically intended for controlling MRI apparatus 30. Although not specifically shown, MRI apparatus 30 includes a magnet to create permanent magnetic field, a plurality of gradient coils to produce spatial variations of magnetic field, and an RF transceiver and receiver systems to transmit and receive RF signals to and from a plurality of RF coils, as will be well known to those of ordinary skill in the art of MRI. Accordingly, details of the MRI apparatus need not be specifically illustrated or discussed herein.

Computer 32 is coupled to a display 34 which is used for displaying MRI images to an operator. Included within computer 32 is a processor 36. A memory 38 (with both read only memory (ROM) and random access memory (RAM), a storage 40 (such as a hard drive or other non-volatile data storage device) for storage of data and software programs, an interface 44, and a compact disk (CD) drive 46 are coupled to processor 36 through a bus 42. CD drive 46 can play a CD 48 on which machine instructions are stored for implementing the present invention and other software modules and programs that may be run by computer 32. The machine instructions are loaded into memory 38 before being executed by processor 36 to carry out the steps of the present invention.

Operation of MRI apparatus 30 is controlled by computer 32 when processor 36 executes the machine instructions stored in memory 38. These machine instructions cause the processor to implement the sequence using two or more double inversion procedures, each followed by an inversion delay period, as discussed above. The resulting image is displayed on display 34 using data stored in storage 40 to enable further processing. It is also noted that the machine instructions will cause processor 36 to determine the appropriate inversion delay periods following each double inversion procedure so as to minimize a deviation of the blood magnetization from zero over a relatively wide range of $T_1$.

CONCLUSION

The QIR pulse sequence in accord with the present invention allows high-quality black-blood images to be obtained both before and after administration of the gadolinium-based contrast enhancement agent. The method of the present invention thus provides reliable quantitative interpretation of a contrast enhancement in tissues and can be employed for MRI in a wide spectrum of cardiovascular applications.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A method for suppressing a signal from flowing blood in a signal used for magnetic resonance imaging (MRI) of a site in a subject, comprising the steps of:
   (a) generating a preparative sequence of radiofrequency (RF) pulses before executing a data acquisition sequence to image the site, a total number of the said RF pulses being an even number at least equal to four;
   (b) applying said RF pulses to the subject prior to executing the data acquisition sequence to image the site, so that the said RF pulses are grouped into a plurality of double inversion procedures, each double inversion procedure including a non-selective RF pulse targeted to the subject and a slice-selective RF pulse that is targeted to a target selected from the group consisting of a slice, a group of slices, and a three-dimensional slab at the site, wherein one of the non-selective RF pulse and the slice-selective RF pulse immediately follows the other of the non-selective RF pulse and the slice-selective RF pulse;
   (c) waiting a predefined time period after each of the double inversion procedures; and
   (d) after the predefined time period following a last of the double inversion procedures, executing the data acquisition sequence for acquiring a signal that is processed to produce and display an image of the site thereby enabling a clear visual evaluation of anatomic structures and pathologic tissues of interest for diagnostic purposes of the site, because said signal from the flowing blood is substantially suppressed in the signal used to produce the image of the site.

2. The method of claim 1, wherein the predefined time periods are determined so that the longitudinal magnetization of flowing blood is substantially zero when the signal used to produce the image is acquired.

3. The method of claim 1, further comprising the step of infusing a contrast-enhancing agent in the subject before generating the sequence of RF pulses, wherein the predefined time periods are determined so that the signal from flowing blood is sufficiently suppressed at any value of a $T_1$ parameter affected by the infusion of the contrast-enhancing agent.

4. The method of claim 1, wherein the sequence of RF pulses comprise a first double inversion procedure and a second double inversion procedure, the first double inversion procedure being followed by a first predefined time period, $TI_1$, and a second double inversion procedure being followed by a second predefined time period, $TI_2$.

5. The method of claim 4, wherein the longitudinal magnetization of the blood is defined as a function of:
   (a) a repetition time, TR;
   (b) a $T_1$ parameter for the flowing blood;
   (c) the first predefined time period $TI_1$; and
   (d) the second predefined time period $TI_2$.

6. The method of claim 5, wherein the first and the second predefined time periods, $TI_1$ and $TI_2$, are determined so that the longitudinal magnetization of the flowing blood is substantially zero over a wide range of the $T_1$ parameter.

7. A method for suppressing the signal from flowing fluid in magnetic resonance imaging (MRI) after infusion of a contrast agent, comprising the steps of:
   (a) prior to executing a data acquisition sequence to acquire an image, carrying out a first double inversion procedure that includes applying in rapid succession and in either order a non-selective inversion RF pulse and a slice-selective inversion RF pulse, said slice-selective inversion RF pulse being targeted at a target selected from the group consisting of a slice, a group of slices, and a three-dimensional slab;
   (b) waiting a first predefined inversion delay period after application of the first double inversion procedure;
   (c) after the first predefined inversion delay period is complete and prior to executing the data acquisition sequence to acquire the image, carrying out a second double inversion procedure that includes again applying in rapid succession and in either order a non-selective inversion RF pulse and a slice-selective inversion RF pulse targeted at the target;
   (d) waiting a second predefined inversion delay period after application of the second double inversion procedure; and
   (e) after the second predefined inversion delay period is complete, executing the data acquisition sequence, which comprises a sequence of RF and magnetic field gradient pulses for acquiring a signal that is processed to produce and display the image in which the signal from flowing fluid appears suppressed and in which a tissue surrounding the fluid is consistently visible to aid in diagnosing and evaluating pathologic tissues of interest.

8. The method of claim 7, wherein the step of executing the sequence of RF and magnetic field gradient pulses comprises the step of suppressing the signal from flowing fluid that comprises blood, and wherein the tissue surrounding the fluid comprises one of a wall of a blood vessel and a heart.

9. The method of claim 7, wherein the first predefined inversion delay period and the second predefined inversion delay period are selected so that a longitudinal magnetization of the fluid is substantially zero when the signal is acquired for processing to produce the image.

10. The method of claim 7, wherein a longitudinal magnetization of the fluid is defined as a function of:
(a) a repetition time, TR;
(b) a $T_1$ parameter for the fluid;
(c) the first predefined inversion delay period; and
(d) the second predefined inversion delay period.

11. The method of claim 7, further comprising the step of employing steps (a)-(e) after administration of a contrast enhancement agent which includes but is not limited to a gadolinium derivative.

12. The method of claim 7, further comprising the step of using the first and the second double inversion procedures for suppressing a contribution of the fluid to the image over a wide range of $T_1$, for the fluid with the contrast enhancement agent infused therein.

13. A method for contrast-enhanced black-blood magnetic resonance imaging (MRI) of a site so that tissue surrounding blood is clearly visible and the blood is consistently black in an image of the site, comprising the steps of:
(a) infusing a contrast enhancement agent into the blood so that the blood carrying a portion of the contrast enhancement agent is flowing through the site to be imaged;
(b) prior to executing an image acquisition sequence, carrying out a first double inversion procedure;
(c) waiting a first predefined inversion delay period after carrying out the first double inversion procedure;
(d) after the first predefined inversion delay period is complete and prior to executing the image acquisition sequence, carrying out a second double inversion procedure, each of the first and the second double inversion procedures including the steps of applying in rapid succession and in either order a non-selective inversion RF pulse and a slice-selective inversion RF pulse, said slice-selective inversion RF pulse being targeted to a target selected from the group consisting of a slice, a group of slices, and a three-dimensional slab at the site;
(e) waiting a second predefined inversion delay period after carrying out the second double inversion procedure; and
(f) after the second predefined inversion delay period is complete, executing the image acquisition sequence for acquiring a signal for processing to produce and display the image, in which flowing blood is consistently black, thereby enabling a clear visualization of pathological tissues of interest at the site.

14. The method of claim 13, wherein the first and second predefined inversion delay periods are selectively determined so that a signal from the flowing blood is suppressed in the image over a relatively wide range of $T_1$ values for the blood carrying the portion of the contrast enhancement agent.

15. The method of claim 13, wherein a longitudinal magnetization of the flowing blood is substantially zero at a time when the signal is acquired.

16. The method of claim 13, wherein said longitudinal magnetization varies as a function of the first predefined inversion delay period, the second predefined inversion delay period, a repetition time (TR), and a $T_1$ value of the blood carrying the portion of the contrast enhancement agent.

17. The method of claim 13, wherein the step of administering the contrast enhancement agent comprises the step of administering a contrast enhancement agent comprising a gadolinium derivative.

18. The method of claim 13, further comprising the step of applying the first double inversion and the second double inversion, each followed by the predefined inversion delay periods, so that a signal is acquired for producing a non-enhanced image obtained before the contrast enhancement agent is infused into the blood.

19. The method of claim 18, wherein the said non-enhanced image is obtained with inversion delay periods and a repetition time (TR) that are the same as the inversion delay periods and the repetition time (TR) used when producing the image after the contrast enhancement agent was infused.

20. The method of claim 19, wherein the said non-enhanced image and the said image produced after the contrast enhancement was infused are used to quantitatively measure changes of signal intensities in tissues caused by the contrast enhancement agent.

21. A controller for generating a pulse sequence for inversion-recovery magnetic resonance imaging of a site, comprising:
(a) a memory in which a plurality of machine executable instructions are stored; and
(b) a processor that is coupled to the memory and executes the machine executable instructions, causing the pulse sequence to be generated, said pulse sequence being characterized by including:
(i) a first double inversion pulse pair generated to comprise and to be applied in rapid succession and in either order prior to execution of an acquisition sequence to image the site, a slice-selective inversion radiofrequency (RF) pulse, and a non-selective inversion RF pulse;
(ii) a first delay period that begins after application of the first double inversion pulse pair;
(iii) a second double inversion pulse pair generated to comprise and to be applied in rapid succession and in either order prior to execution of the acquisition sequence to image the site, a slice-selective inversion RF pulse, and a non-selective inversion RF pulse;
(iv) a second delay period that begins after application of the second double inversion pulse pair; and
(v) the acquisition sequence comprising RF pulses and magnetic field gradient pulses generated for spatial encoding and readout of a signal for producing an image of the site.

22. The controller of claim 21, wherein the slice-selective inversion RF pulse and the non-selective inversion RF pulse produce at least a partial if not a complete inversion of longitudinal magnetization.

23. The controller of claim 21, wherein the first and the second delay periods are not equal.

24. The controller of claim 21, wherein the first and the second delay periods are selected to ensure that a magnetization of blood is substantially zero when the acquisition sequence occurs.

25. The controller of claim 21, wherein the pulse sequence further comprises more than two double inversion pulse pairs.

26. The controller of claim 21, wherein said non-selective inversion pulses are rectangular pulses.

27. The controller of claim 21, wherein said non-selective inversion pulses are adiabatic phase-modulated pulses.

28. The controller of claim 21, wherein said slice-selective inversion pulses are adiabatic phase-modulated pulses.

29. The controller of claim 21, wherein said slice-selective pulses are further characterized by being targeted to a target selected from the group consisting of a single slice, a group of slices, and a three-dimensional slab.

30. The controller of claim 21, wherein execution of the machine executable instructions by the processor cause said acquisition sequence that is used to be selected from the group consisting of two-dimensional data acquisition, and three-dimensional data acquisition.

31. A system for carrying out quadruple inversion-recovery preparative pulse sequence, followed by data acquisition, comprising:
   (a) an MRI apparatus adapted for producing an image of a site; and
   (b) a computer coupled to the MRI apparatus to control it, said computer including:
      (i) a memory in which machine instructions are stored; and
      (ii) a processor coupled to the memory, said processor executing the machine instructions to control the MRI apparatus to carry out a sequence of operations, including:
         (1) prior to executing a data acquisition procedure to image the site, initiating a preparative sequence by generating and applying in rapid succession a pair of radiofrequency (RF) inversion pulses, one RF inversion pulse being selective and the other being non-selective;
         (2) waiting for a first predefined delay period after application of the pair of RF inversion pulses;
         (3) after the first predefined delay period is complete and prior to executing the data acquisition procedure to image the site, again generating and applying in rapid succession the pair of RF inversion pulses, one of which is selective and the other of which is non-selective;
         (4) waiting for a second predefined delay period after application of the pair of RF inversion pulses; and
         (5) after the second predefined delay period is complete, generating the data acquisition pulse sequence in order to acquire a magnetic resonance signal for use in producing the image of the site.

32. The system of claim 31, wherein the machine instructions further cause the processor to determine the first and the second predefined delay periods so as to minimize a deviation of blood magnetization from zero, over a defined range of $T_1$ of blood at the site.

33. The system of claim 31, wherein the machine instructions further cause the processor to determine the first and the second predefined delay periods so that blood magnetization at the site is substantially zero when the magnetic resonance signal is acquired.

34. The system of claim 31, wherein the machine instructions enable an operator to input the first and the second predefined delay periods.

35. The system of claim 31, wherein the machine instructions cause the processor to control the MRI apparatus so that the preparative sequence is periodically repeated with a repetition time that is defined by an operator.

36. The system of claim 31, wherein the machine instructions cause the processor to enable an operator to selectively run the sequence in synchronization with a cardiac rhythm of a subject that is being imaged, with a period equal to at least one systolic period.

37. A memory medium on which machine readable instructions are stored, which when executed by a computing device that is coupled to MRI apparatus, cause the MRI apparatus to carry out a plurality of functions, including:
   (a) prior to executing a data acquisition sequence, generating a preparative sequence of radiofrequency (RF) pulses, a total number of the said RF pulses being an even number at least equal to four;
   (b) applying said RF pulses to a subject prior to executing the data acquisition sequence in such a manner so that the said RF pulses are grouped into a plurality of double inversion procedures, each double inversion procedure including a non-selective RF pulse targeted to the subject and a slice-selective RF pulse that is targeted to a target selected from the group consisting of a slice, a group of slices, and a three-dimensional slab at the site, wherein one of the non-selective RF pulse and the slice-selective RF pulse immediately follows the other of the non-selective RF pulse and the slice-selective RF pulse;
   (c) delaying for a predefined time period after each of the said double inversion procedures; and
   (d) after delaying the predefined time period following a last of the said double inversion procedures, applying the data acquisition sequence comprising the step of acquiring a signal that is processed to produce and display an image of the site, thereby enabling a clear visual evaluation of anatomic structures and pathologic tissues of interest for diagnostic purposes of the site, because said signal from the flowing blood is substantially suppressed in the signal used to produce the image of the site.

38. A memory medium on which machine readable instructions are stored, which when executed by a computing device that is coupled to MRI apparatus, cause the MRI apparatus to carry out a plurality of functions to be executed prior to execution of a signal acquisition sequence to image a site, including:
   (a) prior to execution of the signal acquisition sequence to image the site, carrying out a first double inversion procedure of the site;
   (b) waiting a first predefined inversion delay period; and
   (c) prior to execution of the signal acquisition sequence to image the site, carrying out a second double inversion procedure of the site, each of the first and the second double inversion procedures including the steps of applying in rapid succession and in either order a non-selective inversion RF pulse and a slice-selective inversion RF pulse, said slice-selective inversion RF pulse being targeted at a target selected from the group consisting of a slice, a group of slices, and a three-dimensional slab at the site.

\* \* \* \* \*